(12) United States Patent
Yu-Tung et al.

(10) Patent No.: US 7,239,023 B2
(45) Date of Patent: Jul. 3, 2007

(54) PACKAGE ASSEMBLY FOR ELECTRONIC DEVICE

(75) Inventors: Huang Yu-Tung, Taipei (TW); Wu Chih-Hsyong, Taipei (TW); Hsu Yung-Cheng, Bade (TW)

(73) Assignee: Tai-Saw Technology Co., Ltd., Taoyuan (TW)

( * ) Notice: Subject to any disclaimer, the term of this patent is extended or adjusted under 35 U.S.C. 154(b) by 0 days.

(21) Appl. No.: 10/671,334

(22) Filed: Sep. 24, 2003

(65) Prior Publication Data

US 2005/0062167 A1   Mar. 24, 2005

(51) Int. Cl.
  *H01L 23/28* (2006.01)
  *H01L 23/31* (2006.01)
  *H01L 29/40* (2006.01)
(52) U.S. Cl. .............................. 257/778; 257/E23.125; 257/E21.511; 257/780; 257/698; 257/783; 257/782; 257/668; 257/737; 257/738; 257/772; 257/779; 257/734; 257/691
(58) Field of Classification Search ........ 257/E21.511, 257/E23.125, 778–780, 772–774, 680, 698, 257/782–784, 786, 737, 738, 696, 758, 734, 257/668; 174/260, 261, 777; 361/760, 772, 361/777
See application file for complete search history.

(56) References Cited

U.S. PATENT DOCUMENTS

| | | | | |
|---|---|---|---|---|
| 4,545,610 A | * | 10/1985 | Lakritz et al. | 438/125 |
| 4,927,697 A | * | 5/1990 | Hill | 428/198 |
| 5,120,678 A | * | 6/1992 | Moore et al. | 29/840 |
| 5,136,366 A | * | 8/1992 | Worp et al. | 257/687 |
| 5,220,200 A | * | 6/1993 | Blanton | 257/778 |
| 5,523,628 A | * | 6/1996 | Williams et al. | 257/777 |
| 5,557,150 A | * | 9/1996 | Variot et al. | 257/787 |
| 5,633,535 A | * | 5/1997 | Chao et al. | 257/778 |
| 5,659,203 A | * | 8/1997 | Call et al. | 257/778 |
| 5,969,461 A | * | 10/1999 | Anderson et al. | 310/313 R |
| 6,078,229 A | * | 6/2000 | Funada et al. | 333/193 |
| 6,150,748 A | * | 11/2000 | Fukiharu | 310/313 R |
| 6,214,650 B1 | * | 4/2001 | Nagerl et al. | 438/127 |
| 6,228,679 B1 | * | 5/2001 | Chiu | 438/108 |

(Continued)

FOREIGN PATENT DOCUMENTS

JP   2000-299330   * 10/2000

(Continued)

OTHER PUBLICATIONS

NN87044736, Apr. 1, 1987, Area Array Substrate-To-Carrier Interconnection Corner Standoff, IBM Technical Disclosure Bulletin, Apr. 1987, US; Volumel No. 29, Issue No. 11, Page No. 4736-4737.*

(Continued)

*Primary Examiner*—Alexander Oscr Williams
(74) *Attorney, Agent, or Firm*—Perkins Coie LLP

(57) ABSTRACT

A buffer layer is formed on a substrate and then electronic devices are packed on the buffer layer in the present invention, and problems of lower hermeticity and complex process in the conventional arts can be avoided. Therefore, the present invention provides a packaging structure and method with a better hermeticity and a simpler process. Especially, due to the buffer layer, the planarization for flip-chip bonding can be improved and reduce negative effects of the packing process.

11 Claims, 9 Drawing Sheets

U.S. PATENT DOCUMENTS

| | | |
|---|---|---|
| 6,262,513 B1 | 7/2001 | Furukawa et al. |
| 6,310,421 B2 | 10/2001 | Morishima |
| 6,459,164 B2 * | 10/2002 | Nagerl et al. ............... 257/795 |
| 6,492,194 B1 * | 12/2002 | Bureau et al. .............. 438/106 |
| 6,560,122 B2 * | 5/2003 | Weber ........................ 361/783 |
| 6,642,626 B2 * | 11/2003 | Park ........................ 257/778 |
| 2001/0040298 A1 * | 11/2001 | Baba et al. ................. 257/778 |
| 2002/0000895 A1 * | 1/2002 | Takahashi et al. .......... 333/133 |
| 2002/0149298 A1 * | 10/2002 | Furukawa et al. .......... 310/340 |
| 2003/0009864 A1 | 1/2003 | Kim et al. |
| 2003/0047801 A1 * | 3/2003 | Azuma ....................... 257/700 |
| 2003/0090338 A1 * | 5/2003 | Muramatsu ................. 333/133 |
| 2003/0113054 A1 * | 6/2003 | Furuyama ................... 385/14 |
| 2003/0127747 A1 * | 7/2003 | Kajwara et al. ............. 257/778 |
| 2003/0155639 A1 * | 8/2003 | Nakamura et al. .......... 257/680 |
| 2003/0209813 A1 * | 11/2003 | Azuma ....................... 257/797 |
| 2004/0234689 A1 * | 11/2004 | Morganelli et al. ......... 427/256 |
| 2005/0056946 A1 * | 3/2005 | Gilleo ........................ 257/783 |

FOREIGN PATENT DOCUMENTS

| | | |
|---|---|---|
| WO | WO 99/43084 | 8/1999 |
| WO | WO 03/012856 | 2/2003 |

OTHER PUBLICATIONS

NN79081064 IBM Technical Disclosure Bulletin, Aug. 1979, US, "Modulat Cap Monting" vol. # 22; Issue # 3, pp. 1064, Publication date Aug. 1, 1979.*

* cited by examiner

16

PACKAGE ASSEMBLY FOR ELECTRONIC DEVICE

TECHNICAL FIELD

This invention relates to a structure of electronic devices mounted with a buffer layer and a method of making same, and more particularly to a packaging structure with the buffer layer improving the planarization of flip-chip and reducing negative effects during packaging process.

BACKGROUND

The wire bonding is adopted in the conventional packaging technologies and it needs processes including a lead frame or a substrate, die attach, bonding, molding, trim, form, and so on. The packaged integrated circuit (IC) is several times the size of the chip. However, the I/O (input/output) pins are rapidly increased and the developed tendency for electronic devices is toward miniaturization, so the wire bonding can not satisfy the request. The various package technologies, such as Tape Automated Bonding (TAB), Ball Grid Array (BGA), Flip-Chip, etc., are developed in succession for improving or remedying the drawbacks of the conventional package technology.

The aforementioned Flip-Chip technology is an advanced package technology for connecting chip and substrate. During packaging process, the chip is "flipped" and so the pads of the chip connect with the pads of the substrate. The materials of substrate suitable for Flip-Chip generally include ceramic substrate, silicon wafer, polymer, glass and so on. The applications thereof are very wide, including computer, PCMCIA card, martial equipment, personal communications, clocks, watches, LCD, SAW (surface acoustic wave) device, etc.

To employ Flip-Chip mainly has two advantages. First the signal transmitting distance can be reduced and so it is suitable for package of high-speed device; second, the size of the packaged chip can be reduced as the size of chip before packaging, so it is suitable for the IC device requiring a smaller packaging size.

Although the Flip-Chip technology has some advantages, it still has some inherent drawbacks or limitations, e.g.: high precise assembly, curing time, low reliability for certain substrates, etc. For solving and improving these inherent drawbacks or limitations, different Flip-Chip technologies are made to overcome these inherent drawbacks. Some Flip-Chip technology will be described and illustrated below.

In the U.S. Pat. No. 6,310,421 and U.S. Application No. 20030009864, an air gap package technology is disclosed. As shown in FIG. 1A, it shows a packaging structure disclosed in the U.S. Pat. No. 6,310,421. The air gap package technology is to form an air gap 117 on an active region 105 of an electronic device 110 among air gap layers 115 and 116 and then the chip is flipped on a substrate 120. The hermeticity of the structure formed by the air gap package technology is very good, but it needs two developments and so the process thereof is more complicated and, further, the height of the structure is higher.

Film package technology, as disclosed in the U.S. Pat. No. 6,492,194, WO 99/43084 and WO 03/012856, employs a film formed on an electronic device and a substrate and presses the film to tightly rest on the electronic device and the substrate. As shown in FIG. 1B, it is the diagram of the structure disclosed in WO 03/012856, the film 240 rests tightly on the electronic device 210 and the structure 220. However, the hermeticity of the structure is insufficient, especially the portion of the film 270 at the side of the electronic device 210 becomes thick when the film 240 is pressed and formed, as shown in FIG. 1C. Therefore, gas may easily pass through the portion of the film 270. Moreover, the voids near the attaching point between the portion of the film 270 function as dropper to decrease the hermeticity of the structure. Furthermore, due to the moisture, etc. attacking the packaged device during the many times of lowering and raising temperature, the characteristics of device will be changed or the packaged device will be damaged. Hence, another film 260 must be formed on the film 240 to enhance the hermeticity and so the complication of the process is higher.

In the U.S. Pat. No. 6,078,229, it discloses a packaging structure with resin film 330 and the method of making the same, as shown in FIG. 1D. The advantage thereof is that the metal layer does not need to be formed and so weight and cost are reduced. Nevertheless, the resin film 330 must to be formed several openings thereon for not recovering a vibration cavity 317 of a surface acoustic wave device 314 and the bump 316, the process is required higher preciseness and is more complicated.

Another package technology is the Underfill package technology. FIG. 1E shows the structure of Underfill package technology disclosed by the U.S. Pat. No. 5,969,461. The resin 440 will flow into the space between the electronic device 410 and the substrate 420 during the time from injecting the resin 440 to the resin 440 have been cured. Therefore, the dam 480 is added for avoiding the resin 440 attaching the active region of the electronic device 410 and effecting the characteristic of the electronic device, such as surface acoustic wave device. Furthermore, the redundant portion of the resin must be cleaned. Hence, the process is more complicated and increases cost thereof.

In the U.S. Pat. No. 6,262,513, encapsulation resin package technology is disclosed, as shown in FIG. 1F. A resin layer 540 is recovered on an electronic device 510 and the substrate 520. The resin layer 540 must be low fluid for avoiding flowing into the space between the electronic device 510 and the substrate 520 and effecting the characteristic of the electronic device as the Underfill package technology. Nevertheless, the resin layer 540 has the problem of thermal expansion when heating for curing the resin. $SiO_2$ is added into the resin layer 540 in order to reduce a thermal stress due to the difference of thermal expansion coefficient, but it results in decreasing the adhesion between the resin layer 540 and wires 590 and the hermeticity of the structure is so unsatisfactory.

SUMMARY

In aforementioned prior arts, the processes of the conventional package technologies have problems of high complexity and unsatisfactory hermeticity. One of objectives of the present invention is to form a buffer layer between electronic devices and a substrate to achieve a fine hermeticity and the process thereof is very simple.

Another objective of present invention is to employ the buffer layer to improve the planarization between the electronic devices and the substrate.

Another objective of present invention is to employ to compress the buffer layer during packaging process for intensifying the density and extending gas escaping contour. Therefore, the gas escaping contour of passing through the buffer layer and escaping along the connecting face between the electronic devices and the buffer layer becomes longer and more difficult. Hence, the present invention provides a structure with a good hermeticity to protect the packaged device from erosions of the moisture, oxygen, carbon dioxide and so on.

As aforementioned, the present invention provides a package assembly for an electronic device. The package assembly comprises a substrate and a buffer layer. The substrate has a first surface with a first plurality of contact pads and a second plurality of contact pads, a second surface with a plurality of connection pads, and a plurality of via holes connecting the first plurality of contact pads and the plurality of connection pads. The buffer layer is between the substrate and the electronic device, and a surface of the electronic device has electrodes opposite to the first surface of the substrate. The buffer layer has an opening to expose the first plurality of contact pads. Wherein the buffer layer surrounds the edge of the electronic device and a fastening face of the edge of the electronic device and the buffer layer is unflattened.

The present invention also provides a package assembly for a plurality of electronic devices. The substrate has a first surface with a first plurality of contact pads and a second plurality of contact pads, a second surface with a plurality of connection pads, and a plurality of via holes connecting the first plurality of contact pads and the plurality of connection pads. A buffer layer has a plurality of openings to expose the first plurality of contact pads, and the plurality of electronic devices is on the plurality of openings respectively. Wherein a respective surface of the plurality of electronic devices having electrodes is opposite to the first surface of the substrate, the buffer layer surrounds the edge of the plurality of electronic devices, and fastening faces of the edge of the plurality of electronic devices and the buffer layer are unflattened.

The present invention further provides a packaging method for electronic devices. The method comprises: forming a buffer layer on a first surface of a substrate, the buffer layer having a first opening to expose a first plurality of contact pads on the first surface, wherein the substrate has the first surface with the first plurality of contact pads and a second plurality of contact pads, a second surface with a plurality of connection pads, and a plurality of via holes connecting the first plurality of contact pads and the plurality of connection pads; and mounting a first electronic device on the buffer layer corresponding to the first opening, wherein a surface of the electronic device having electrodes is opposite to the first surface of the substrate, the buffer layer surrounds the edge of the first electronic device, and a fastening face of the edge of the first electronic devices and the buffer layer is unflattened.

Hence, compared with the conventional arts having the aforementioned drawbacks, the present invention employs and forms a buffer layer between the electronic device and the substrate to overcome the conventional drawbacks. The buffer layer not only functions as a self-planarization buffer layer to improve the planarization between electronic device and the substrate, but also increases the air escaping distance and difficulty to increase the hermeticity thereof and avoids the moisture, oxygen, carbon dioxide, etc. attacking. Moreover, the process is very simple and so it benefits to improve the yield.

DETAILED DESCRIPTION

Some sample embodiments of the invention will now be described in greater detail. Nevertheless, it should be recognized that present invention can be practiced in a wide range of other embodiments besides those explicitly described, and the scope of the present invention is expressly not limited expect as specified in the accompanying claims.

Then, the components of the different elements are not shown to scale. Some dimensions of the related components are exaggerated and meaningless portions are not drawn to provide a more clear description and comprehension of the present invention.

Due to the conventional Flip-Chip technology has the problems of high complexity and unsatisfied hermeticity, the present invention aims at these and provides a package assembly for electronic device with a buffer layer. The Flip-Chip structure and method of the present invention are very simple and the packaging hermeticity is also increased. In addition, the Flip-Chip technology is to flip the chip for connecting contact pads of the chip and contact pads of the substrate. The planarization (between the chip and the substrate) directly effects the yield of Flip-Chip, especially for gold-gold, and the request for planarization is more exact if the contact pads increases much more. Hence, the function of self-planarization during packaging can be achieved to reduce the problem of planarization through the buffer layer. The aforementioned advantages of the present invention will detailedly describe and illustrate as follows.

Figure 1A:
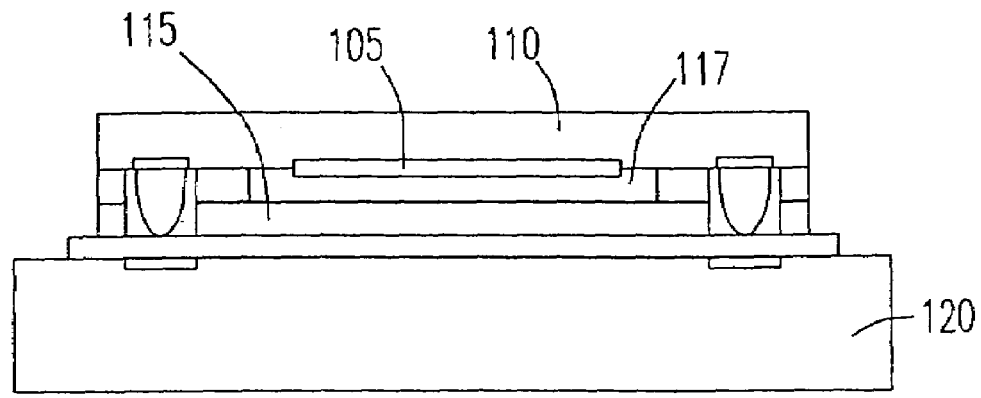
FIG. 1A-FIG. 1F are schematic diagrams of electronic device package technology in the conventional arts.
Figure 1B:
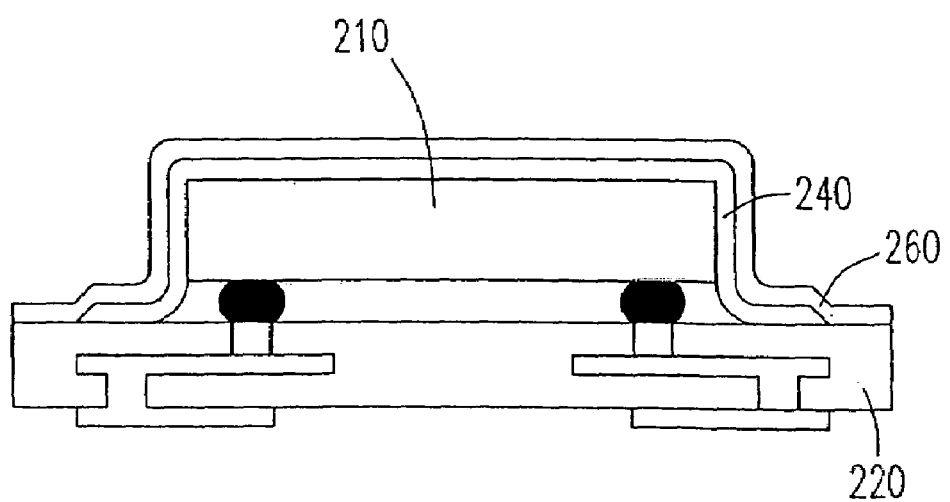
Figure 1C:
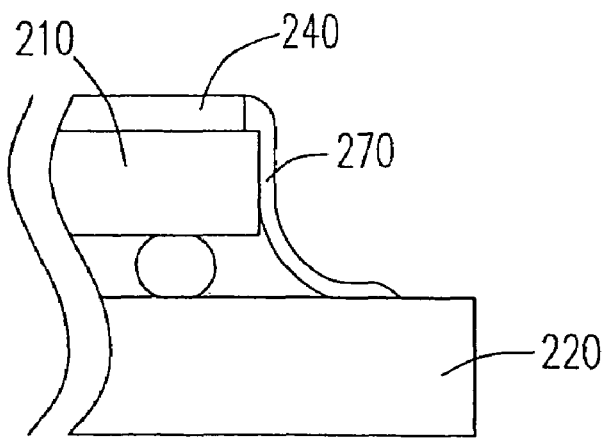
Figure 1D:
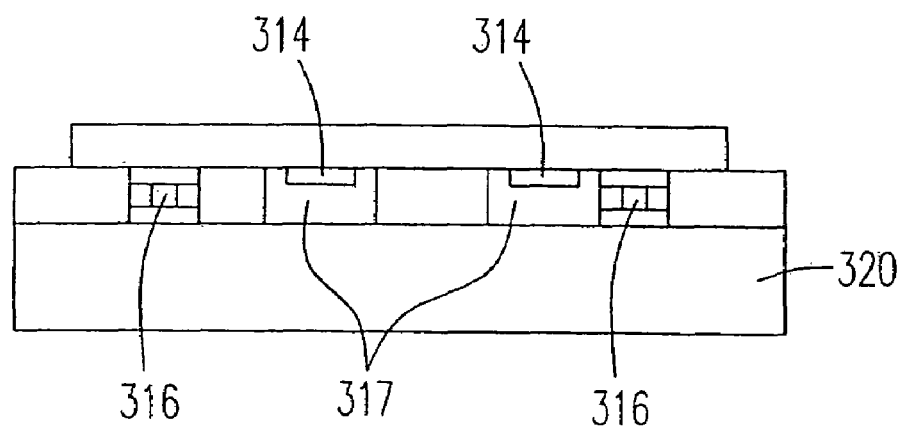
Figure 1E:
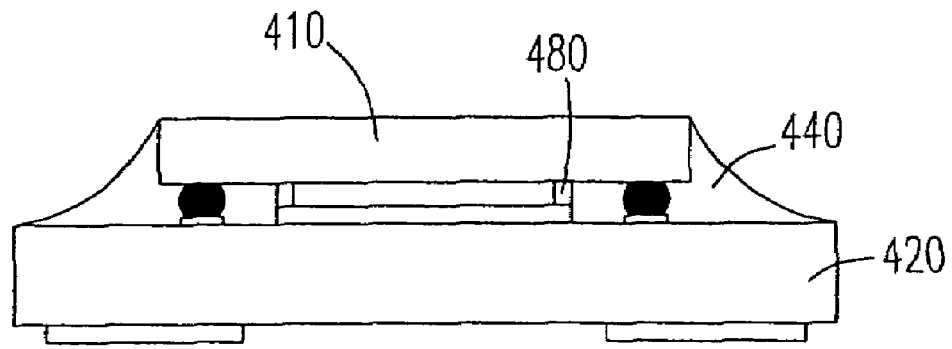
Figure 1F:
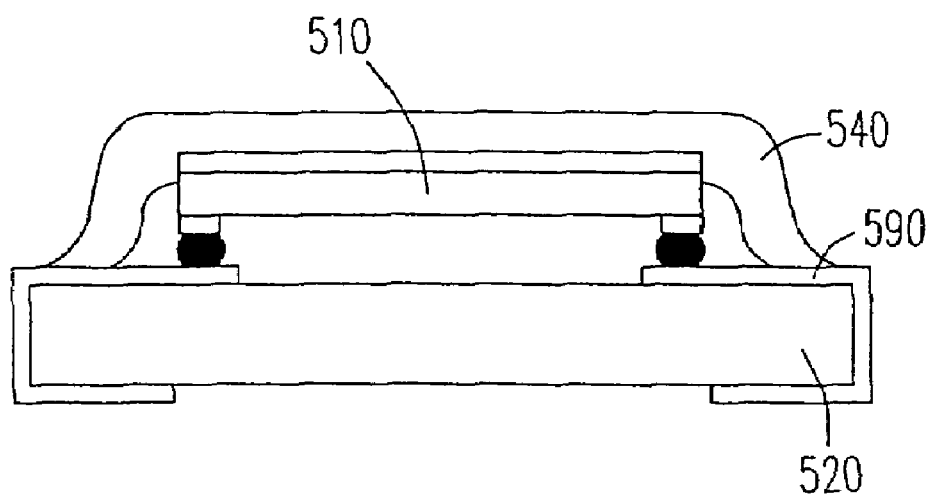
Figure 2A:
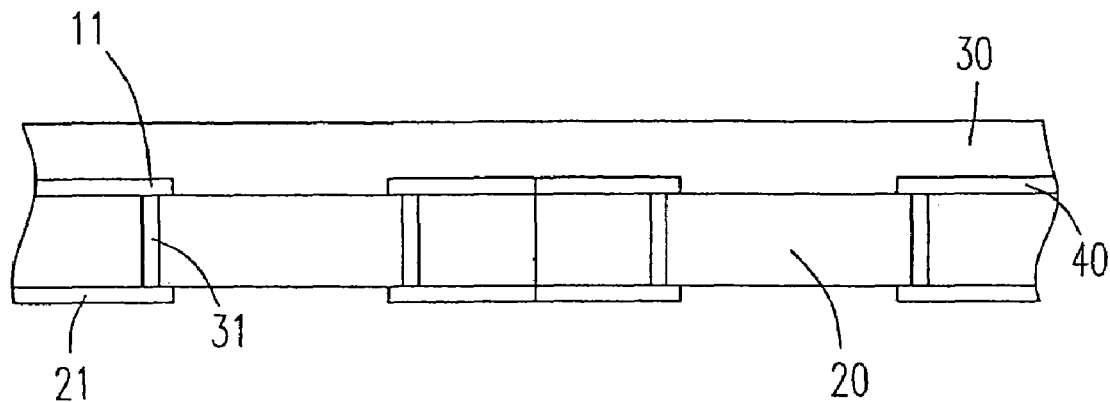
FIG. 2A-FIG. 2C are schematic diagrams of the process of one preferred embodiment in the present invention.
Figure 2B:
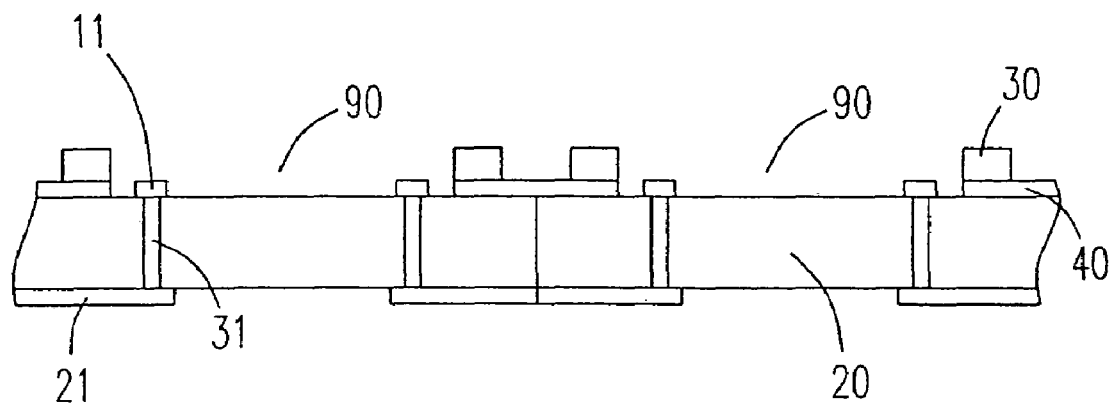
Figure 2C:
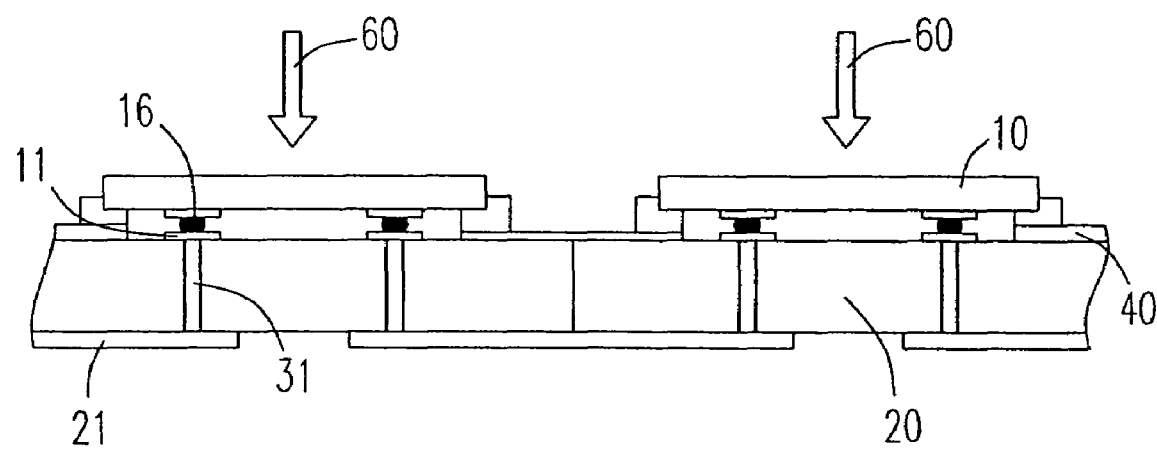

The process in a packaging structure of one preferred embodiment of the present invention is shown in FIG. 2A-FIG. 2C. In FIG. 2A, the first plurality of contact pads 11 and the second plurality of contact pads 40 are on a first surface of a substrate 20, a plurality of connection pads 21 is on a second surface of the substrate 20, and the first contact pads 11 and the connection pads 21 are connected with each other through the via holes 31. Then, a buffer layer 30 is formed on the substrate 20, and the part of the buffer layer 30 except on the second contact pads 40 is removed to form the plurality of openings 90, as shown in FIG. 2B. The process of moving the part of the buffer layer can be proceeded by photolithography or laser, or a buffer layer 30 having preformed openings on the substrate 20. The thickness of the buffer layer is preferably 30-200 microns. Then, each of the electronic device 10 corresponding to one of openings 90 is mounted on the buffer layer and the buffer layer 30 supports the edge of the electronic device, as shown in FIG. 2C. Finally, a bonding process is proceeded for bonding the electronic device 10 and the substrate 20 solidly.

Here the packaging structure through the aforementioned packaging process is detailedly described again. A substrate 20 has a first plurality of contact pads 11, a second plurality of contact pads 40, a plurality of connection pads 21, and a plurality of via holes 31. The first plurality of contact pads 11 and the second plurality of contact pads 40 are in a first surface of the substrate 20, the plurality of connection pads 21 is in a second surface of the substrate 20, and the plurality of via holes 31 connects the first plurality of contact pads 11 and the plurality of connection pads 21. A buffer layer 30 has a plurality of openings to expose the first plurality of contact pads 11. When electronic devices 10 are mounted on the buffer layer 30, the electronic devices correspond to openings respectively, and the edges of the electronic devices 10 fasten with the buffer layer 30.

In general, if the gas were escaped from the space among the electronic device 10, the substrate 20, the buffer layer 30, and the second plurality of contact pads 40, fastening faces between the electronic device 10 and the buffer layer 30 and to pass through the buffer layer 30 are the main escaping way. In the present invention, the buffer layer 30 is pressed to intensify the density thereof and to extend along the space between the electronic device 10 and the substrate 20. Therefore, the thickness of the buffer layer becomes thicker and the fastening faces are not flat and have a corner due to pressure. Hence, compared with the conventional arts, the hermeticity in the present invention is very good. Moreover, a surface of the electronic device 10 fastening with the buffer layer 30 can not be flat, and may be an unflattened surface, such as a sawtooth-shaped surface. Hence, the gas escaping distance is increased to raise the hermeticity.

The aforementioned bonding process may be a conventional bonding process, such as a thermocompression bonding, an ultrasonic bonding, a thermosonic bonding, soldering bonding, and an adhesive bonding, for tightly bonding the electronic device 10 with the buffer layer. In bonding process, a force 60 may be applied to the electronic device 10 to intensify the solid of the portion of the buffer layer 30 connecting with the electronic device 10 for enhancing the resistance to erosions of moisture, oxygen, carbon dioxide, etc that can erode the electronic device or effect the reliability thereof. Furthermore, in the pressing process, the length of the buffer layer 30 is extended along the space between the electronic device 10 and the substrate 20 to extend the length of the gas escaping contour for increasing the escaping difficulty of gas passing through the buffer layer 30. Another gas escaping contour is the fastening face between the buffer layer 30 and the electronic device 10. The fastening face is unflattened and has a corner, and the length thereof is also extended due to the pressure. Hence, the gas is also hard to escape through the fastening face. Accordingly, the structure of the present invention is better than the structure of the conventional arts. On the side, the bonding process may be proceeded under a vacuum, a particular gas, or a mixed gas, e.g. inert gas (nitrogen, hydrogen, helium, etc.), the mixed inert gas. The particular gas or the mixed gas can not include some gases that can erode the electronic device or effect the reliability thereof, such as: moisture, oxygen, carbon dioxide, etc. Hence, the inner gas of the packaged device does not effect the packaged device.

Another advantage of the buffer layer 30 between the electronic device 10 is that the planarization between the electronic device 10 and the substrate 20 can be improved. Particularly, if the bonding process is an ultrasonic bonding or a thermosonic bonding, the buffer layer 30 can efficiently absorb the ultrasonic energy transmitting to the edge of the electronic device 10. However, the ultrasonic energy transmitting to the intermediate conductive elements 16 is not reduced by the buffer layer 30, so the planarization is improved without effecting the bonding, especially the planarization is the main problem for gold-gold bonding. The present invention can employ the buffer layer 30 between the electronic device 10 and the substrate 20 to achieve the function of self-planarization and so the present invention can overcome the planarization problem in the conventional arts.

Types of the electronic device 10 applied with the present invention will not be limited. For example, the package assembly and the method of the present invention can apply to RF components, sensors, EPROM, CCD, semiconductor lasers, LED, SAW and so on. Material types of the substrate 20 applied with the present invention are also various, e.g.: Al, high temperature co-fired ceramics (HTCC), low temperature co-fired ceramics (LTCC), etc. The conventional substrates, such as a silicon wafer, polymer substrate, a glass substrate, etc, are also suitable for the present invention. Although the buffer layer 30 can become solid by the pressure and so the resistances to moisture, oxygen, carbon dioxide, and so on are raised, the material of the buffer layer 30 having high resistances to moisture, oxygen, and carbon dioxide may be selected to enhance the reliability of the packaged device, e.g.: organic compounds and polymers (PET, PEN, PVC, OPP, PI, etc.). The buffer layer 30 may be conductive to enhance the grounding effect.

Figure 3A:
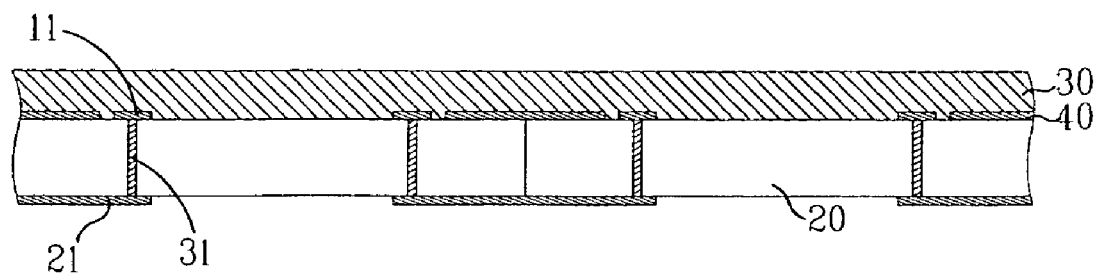
FIG. 3A-FIG. 3E are schematic diagrams of the wafer-level process in the present invention.
Figure 3B:
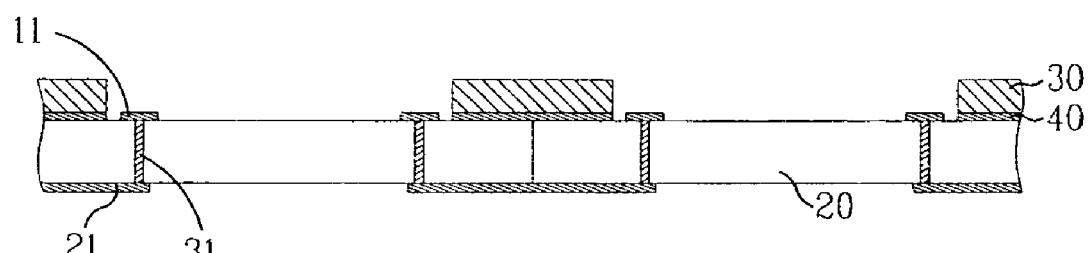
Figure 3C:
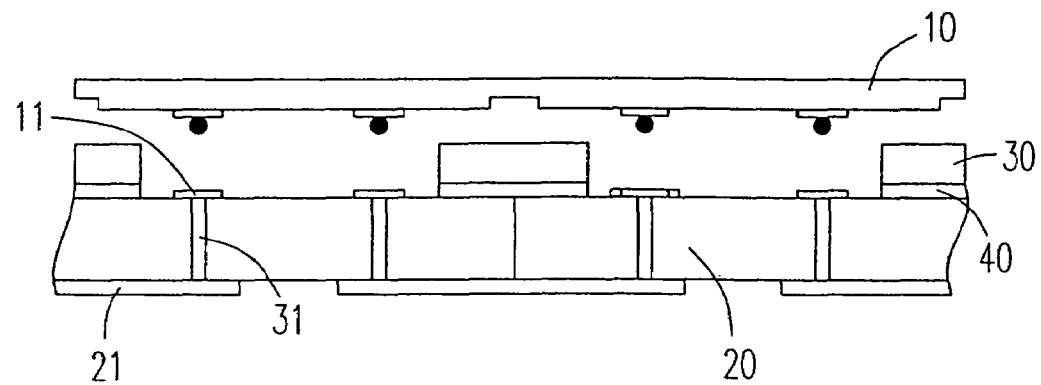
Figure 3D:
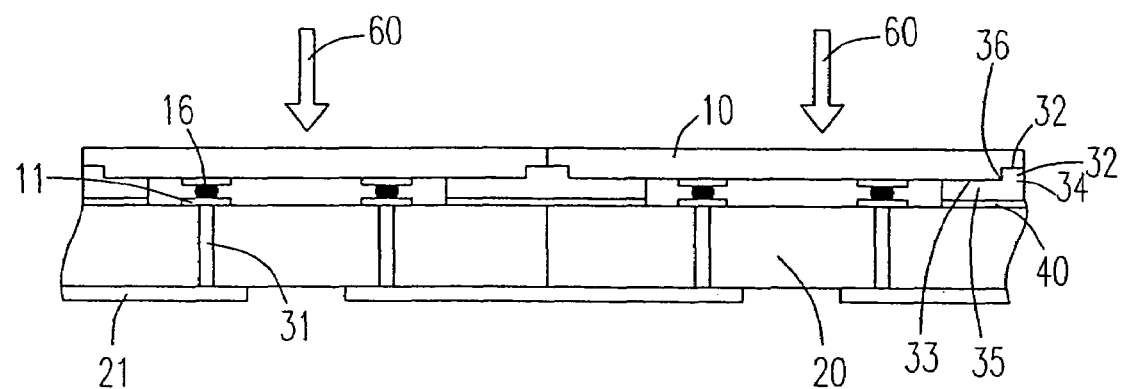
Figure 3E:
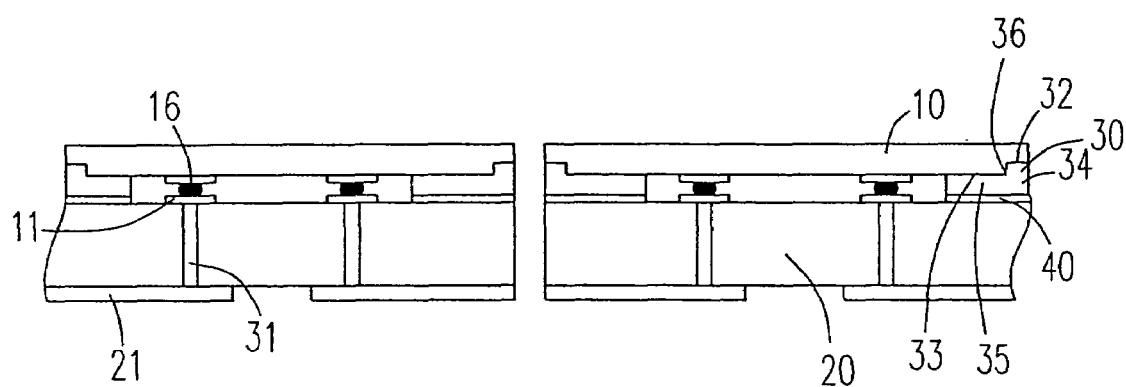

The present invention is also suitable for a process of wafer-level, as shown in FIG. 3A to FIG. 3E. In FIG. 3A, the first plurality of contact pads 11 and the second plurality of contact pads 40 are on a first surface of a substrate 20, a plurality of connection pads 21 is on a second surface of the substrate 20, and the first contact pads 11 and the connection pads 21 are connected with each other through the via holes 31. Then, a buffer layer 30 is formed on the substrate 20, and the part of the buffer layer 30 except on the second contact pads 40 is removed to form the plurality of openings 90, as shown in FIG. 3B. After that, the electronic devices 10 respectively correspond to openings 90 and are mounted on the buffer layer, as shown in FIG. 3C, and the buffer layer 30 supports the edges of the electronic devices 10, as shown in FIG. 3D. A cutting process may be proceeded for dividing into each of the electronic devices 10, as shown in FIG. 3E. The cutting process may be a half cut, so as to match the demand for successive processes. It is to be noted that the buffer layers 30 in FIG. 3D and FIG. 3E are different in shape from that of the buffer layer 30 shown in FIG. 30. In FIG. 3D and FIG. 3E, since the buffer layer 30 has been subject to the force 60 at a specific portion thereof, which will be discussed below, it becomes like a shoulder having a first part 34 with a first surface 32, a second part 35 with a second surface 33 and a corner 36. The first part 34 has a first density and the second part 35 has a second density, which is greater than the first density since the second part 35 has been subject to the force 60 while the first part 34 has not been pressed. In this case, the buffer layer 30 may not only provide the self-planarization function as mentioned above for the electronic device 10 at the second part 35 but also provide the hermetical sealing result at the first part 34 (also mentioned above) concurrently.

Figure 4:
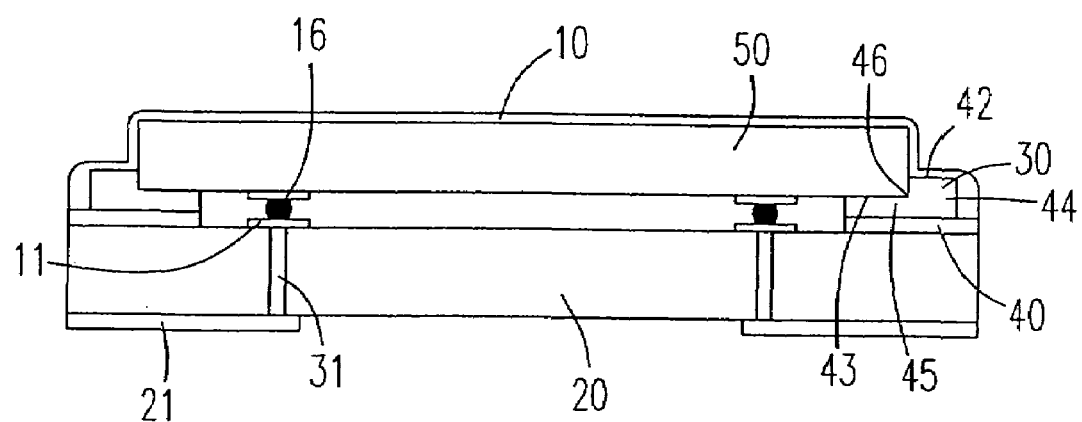
FIG. 4 is a schematic diagram of another preferred embodiment in the present invention.

The another preferred embodiment of the present invention is as shown in FIG. 4. Compared with the aforementioned structure, a conductive layer 50 is formed on the electronic device 10, the buffer layer 30, and the second plurality of contact pads 40. The conductive layer 50 has the function of shielding from electromagnetism wave and increasing the hermeticity. Likewise, the buffer layer 40 in FIG. 4 is formed like a shoulder having a first part 44 with a first surface 42, a second part 45 with a second surface 43 and a corner 46. The first part 44 has a first density and the second part 45 has a second density, which is greater than the first density. In this case, the buffer layer 30 may not only provide the self-planarization function as mentioned above for the electronic device 10 at the second part 45 but also provide the hermetical sealing result at the first part 44 (also mentioned above) concurrently.

Typically, the solder 16 has a height of 50 microns before being pressed by the force 60 and 30 to 40 microns after being pressed and each of the pads 11 has the considerable height value. Therefore, in a preferred embodiment, the buffer layer 30 is set as 30 to 200 microns in thickness, both the first part 44 and second part 45 are alike but with a height difference.

Hence, compared with the conventional arts having the aforementioned drawbacks, the present invention employs to form a buffer layer between the electronic devices and the substrate to overcome the conventional drawbacks. The buffer layer not only functions as a self-planarization buffer layer to improve the planarization between the electronic devices and the substrate, but also increases the air escaping distance and difficulty to increase the hermeticity thereof and avoid the moisture, oxygen, and carbon dioxide attacking. Moreover, the process is very simple and so it benefits to improve the yield.

Although specific embodiments have been illustrated and described, it will be obvious to those skilled in the art that various modifications may be made without departing from what is intended to be limited solely by the appended claims.

We claim:

1. A package assembly for an electronic device having edges, comprising:
    a substrate having a first surface with a first plurality of contact pads and a second plurality of contact pads, a second surface with a plurality of connection pads, and a plurality of via holes connecting said first plurality of contact pads and said plurality of connection pads; and
    a buffer layer between said substrate and said electronic device, and a surface of said electronic device having electrodes being opposite to said first surface of said substrate, said buffer layer having an opening to expose said first plurality of contact pads, wherein said buffer layer has a first part with a first density and a second part with a second density, said first density greater than said second density, wherein said second part of said buffer layer seals said edges of said electronic device and said first part of said buffer layer is configured with said electronic device such that said buffer layer functions as a self-planarization buffer between said electronic device and said substrate for increasing the hermeticity thereof.

2. The package assembly in claim 1, wherein said substrate is selected from the group consisting of an $Al_2O_3$ substrate, a ceramic substrate, a silicon substrate, a polymer substrate, and a glass substrate.

3. The package assembly in claim 1, wherein said buffer layer is selected from the group consisting of an organic film layer and a polymer film layer.

4. The package assembly in claim 1, further comprising a conductive layer formed on said electronic device and said buffer layer.

5. The package assembly in claim 1, wherein said first part has a relatively greater thickness and said second part has a relatively smaller thickness between 30-200 microns.

6. The package assembly in claim 1, wherein said first part is higher than said lower surface of said electronic device in altitude, contacted closely with said electronic device and disposed horizontally outside said electronic device.

7. The package assembly in claim 1, wherein said electronic device is a surface acoustic wave device.

8. A package assembly for an electronic device having edges and a lower surface having electrodes thereon, an upper surface and a vertical side with respect to said lower surface, comprising:
    a substrate having a first surface with a first plurality of contact pads and a second plurality of contact pads, a second surface with a plurality of connection pads, and a plurality of via holes connecting said first plurality of contact pads and said plurality of connection pads; and
    a buffer layer disposed on said substrate and having an opening to expose said first plurality of contact pads, wherein said buffer layer is used for closely sealing said edges of said electronic device and further has a first part and a second part, said first part being lower than said upper surface of said electronic device and higher than said lower surface of said electronic device in altitude.

9. A package assembly for an electronic device having edges, a lower surface having electrodes thereon, an upper surface and a vertical side with respect to said lower surface, comprising:
    a substrate having a first surface with a first plurality of contact pads and a second plurality of contact pads, a second surface with a plurality of connection pads, and a plurality of via holes connecting said first plurality of contact pads and said plurality of connection pads; and
    a buffer layer disposed substantially between said substrate and said electronic device and having an opening to expose said first plurality of contact pads, wherein said buffer layer further forms a shoulder with a first surface disposed alongside said vertical side of said electronic device and being contacted closely with said vertical side and a second surface bearing said electronic device at said lower surface and being contacted closely with said lower surface, so as to closely seal said edges of said electronic device.

10. The package assembly for an electronic device according to claim 9, wherein said first surface being higher than said second surface in altitude and integrally formed with each other.

11. A package assembly for an electronic device having edges, a lower surface having electrodes thereon, an upper surface and a vertical side with respect to said lower surface, comprising:
    a substrate having a first surface with a first plurality of contact pads and a second plurality of contact pads, a second surface with a plurality of connection pads, and a plurality of via holes connecting said first plurality of contact pads and said plurality of connection pads; and
    a buffering means and a hermetical sealing means formed integrally, disposed substantially between said substrate and said electronic device and being contacted with said edges of said electronic device associated with said lower surface, wherein said hermetical sealing means is further contacted closely with said vertical side and said buffering means is further contacted closely with said lower surface.

* * * * *